United States Patent [19]

Foley et al.

[11] Patent Number: 5,085,885
[45] Date of Patent: Feb. 4, 1992

[54] PLASMA-INDUCED, IN-SITU GENERATION, TRANSPORT AND USE OR COLLECTION OF REACTIVE PRECURSORS

[75] Inventors: Henry C. Foley; Robert D. Varrin, Jr.; Sourav K. Sengupta, all of Newark, Del.

[73] Assignee: University of Delaware, Newark, Del.

[21] Appl. No.: 579,772

[22] Filed: Sep. 10, 1990

[51] Int. Cl.$^5$ ............................................... B05D 5/12
[52] U.S. Cl. .................................... 477/38; 75/10.13; 75/10.19; 75/10.2; 75/10.67; 423/DIG. 10; 427/45.1; 427/47; 427/252; 427/255.1; 427/255.4; 427/399
[58] Field of Search ............... 427/38, 45.1, 47, 252, 427/255.1, 255.4, 399; 75/10.13, 10.19, 10.2, 10.67; 423/DIG. 10

[56] References Cited

PUBLICATIONS

D. A. Skoog et al., *Principles of Instrumental Analysis*, Holt, Reinhart, Winston, 1971, p. 13.
S. Veprek et al., *Solid State Electron.*, 11, 683–684 (1968).
S. Veprek et al., *Pure & Appl. Chem.*, 54, 1197–1220 (1982).
S. Veprek et al., *Philosophical Magazine B*, 43, 527–547 (1981).
S. M. Gates et al., *Surf. Sci.* 207, 364–384 (1989).
J. Abrefah et al., *Surf. Sci.* 209, 291–313 (1989).

*Primary Examiner*—Bernard Pianalto

[57] ABSTRACT

A beam or flow of a reactive or metastable precursor such as a hydride or organometallic compound is created, and this beam or flow is used to treat (e.g. dope or coat or otherwise modify) a substrate, e.g. an advanced material such as a semiconductor layer, a photovoltaic cell, or a solar cell. The beam or flow can also be directed into a storage zone so that the precursor or precursors can be collected for future use. The beam or flow is created in an apparatus comprising at least three zones. Zone 1 is irradiated with microwave energy to generate a reactive gas rich in free radicals (e.g. rich in H·, CH$_3$·, etc.) zone 2 (downstream from zone 1) is substantially free of microwave energy and contains a target which is impinged upon by the free radicals and becomes a source of the precursor; zone 3 (downstream from zone 2) is where the precursors are either collected for storage or are used to treat the substrate. In a typical apparatus of this invention, a feed gas such as H$_2$ or CH$_4$ is introduced into an elongated tube 50 which communicates with a microwave cavity 57 containing a microwave plasma. A reactive gas containing free radicals (and perhaps some ions) flows from cavity (57 to target 61, where the free radicals react with the target to form the precursor (e.g. a hydride such as silane). When the precursor enters zone 3 it can treat an advanced material 73, e.g. by decomposing into Si+2H$_2$. The Si is deposited on substrate 73 and the liberated H$_2$ is pumped away. The pumping system also keeps the interior of the apparatus under subatmospheric pressure, e.g. 0.1 to 10 torr.

14 Claims, 2 Drawing Sheets

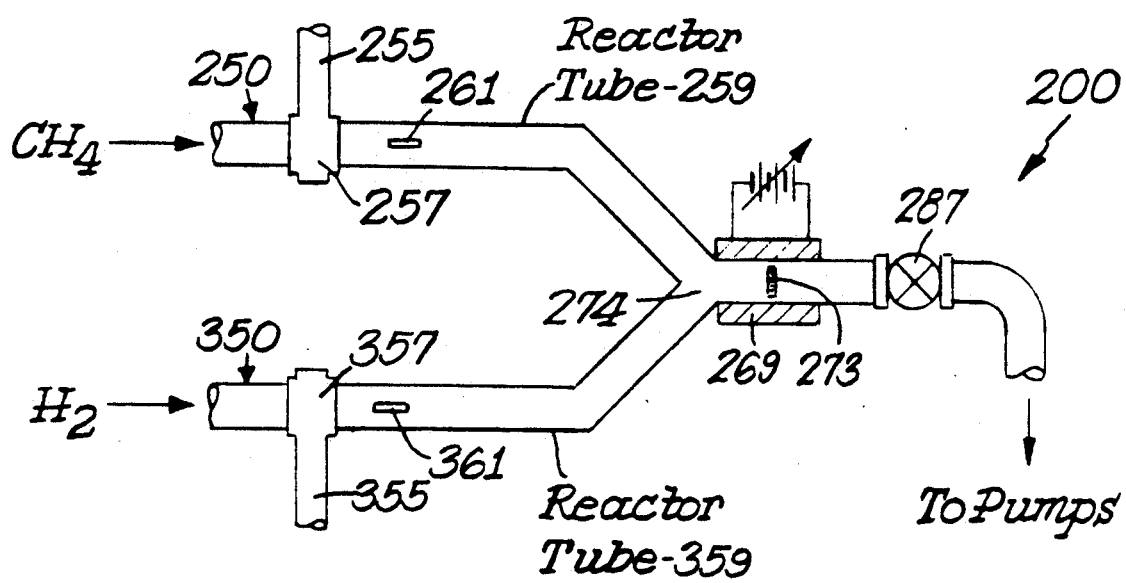
Fig.3.
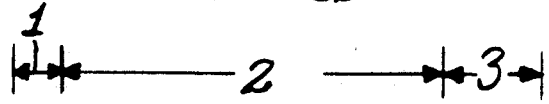

PLASMA-INDUCED, IN-SITU GENERATION, TRANSPORT AND USE OR COLLECTION OF REACTIVE PRECURSORS

This invention was made with United States government support awarded by the National Science Foundation (NSF), grant no. NSF-PYI CBT 8657614. The United States government has certain rights in this invention.

BACKGROUND OF THE INVENTION

1. Field of the Invention

This invention relates to the formation of a beam or flow of precursors for advanced materials, which precursors can be collected for future use or used to make or treat advanced materials such as semiconductor layers, photovoltaic cells, solar cells, or the like. An aspect of this invention relates to the use of microwave energy to prepare hydrides and/or organometallic compounds from volatile or volatilizable molecular species such as molecular hydrogen or molecular hydrocarbons and a metal or metalloid. An aspect of this invention relates to the collection of the hydrides and/or organometallic compounds thus prepared, as well as the use of these hydrides or organometallic compounds to provide (e.g. by decomposition) a source of elemental metal or metalloid which can be reacted with a substrate or deposited upon a substrate, e.g. in the form of metallic or metalloid layers which are extremely thin. Still another aspect of this invention relates to substrates upon which the metal or metalloid has been deposited. Still another aspect of this invention relates to apparatus suitable for carrying out the objectives described above.

2. Description of the Prior Art

It has long been known that extremely thin films of metals or metalloids can be deposited upon substrates. If desired, the thin films can be atomic or molecular in thickness. The ability to deposit such extremely thin films of metals and metalloids (particularly semi-conducting elements such as silicon, germanium, and the like) is of major importance in the field of solar and photovoltaic cells and other advanced materials which require the presence of dopants or semiconductors or other electrically conductive species. A very wide variety of techniques has been developed over the last twenty to thirty years for achieving thin film deposition of the type described above. These techniques have been continually evolving and have recently culminated in the development of three highly sophisticated techniques, i.e. molecular beam epitaxy (MBE), organometallic vapor phase epitaxy (OMVPE), and most recently chemical beam epitaxy (CBE), also referred to by some researchers as atomic layer epitaxy or metalorganic molecular beam epitaxy. Extremely advanced electronic materials can be produced by these processes, and persons skilled in this art believe that these may be the best candidates from amongst a gamut of methods which have been tried over the years for compound semiconductor growth including: sealed-tube synthesis, chemical vapor deposition with halide transport, liquid phase epitaxy, and physical vapor deposition. These earlier methods, from a generation ago, formed the basis for the current generation of highly sophisticated methods. A principal advantage of the more highly sophisticated methods, as compared to the earlier generation of methods, relates to the ability to achieve amazing control over growth and materials properties. Nevertheless, all three of these highly sophisticated techniques have drawbacks.

The most important drawbacks of MBE include: the need for ultrahigh vacuum conditions (hence a very large capital investment), severe limits on throughput rates, and difficulties of source flux control. A typical ultrahigh vacuum used in MBE is on the order of $10^{-10}$ torr. A typical throughput rate amounts to less than $10^{11}$ molecules per square centimeter—orders of magnitude below molar quantities. For many of these reasons, MBE tends to be most effective when used in research rather than in commercial manufacturing, although some commercial use of MBE has been made.

The ultrahigh vacuum requirements of MBE can be avoided completely with OMVPE. Indeed, pressures in excess of 10 torr have been used in OMVPE processes. However, OMVPE has at least one major drawback of its own; the raw material fed to the process is extremely toxic and/or reactive. For example, some OMVPE processes make use of hydrides of metalloids of Group Va of the Periodic Table ($AsH_3$, $SbH_3$, etc.). These hydrides are poisonous and must be handled with extreme care.

CBE represents an attempt to combine the features of MBE and OMVPE. Unfortunately, one is still obliged to use very low pressures (as in MBE), but instead of molecular beams of elemental precursors effused from heated source bottles, molecular beams from organometallic and hydride precursors are utilized.

Accordingly, this invention seeks to move up to still another generation of thin film coating technology which lacks the drawbacks of MBE, OMVPE, and CBE.

SUMMARY OF THE INVENTION

This invention makes use of the principles of microwave plasma formation. Microwave radiation is used to create a plasma containing ions and free radicals, preferably a plasma which is extremely rich in free radicals and relatively poor in ions. This plasma is brought into contact with a target co-reactant metal or metalloid, and, although this invention is not bound by any theory, it is believed that an essentially chemical reaction (etching) between the free radicals and the metal or metalloid creates, in-situ, hydrides and/or organometallic compounds. If desired, the hydrides and/or organometallic compounds can be collected and stored for future use. More typically, the hydrides and/or organometallic compounds are brought into contact with a substrate. What then typically happens is that the hydride or organometallic species liberates the metal or metalloid which then coats or deposits on or dopes or otherwise modifies the substrate. A typical use of this technology is to "grow" a semiconducting layer upon a surface or to dope the surface and cause it to develop photovoltaic properties or the like.

In the method of this invention, it is not necessary to use toxic or dangerous hydride or organometallic starting materials. For example, the species subjected to microwave energy can be hydrogen gas or a volatile or volatilizable hydrocarbon such as methane, ethane, propane, or the like. Highly reactive organometallic compounds or toxic hydrides, if such precursors are needed, can be formed in situ, in the plasma, and do not need to be stored in advance. When these precursors are brought into contact with the substrate, they may then be decomposed into relatively stable and/or innocuous elements or compounds such a hydrogen (which, though chemically reactive, is less reactive then a free radical), hydrocarbons, and metals or metalloids.

The technique of forming a microwave plasma is reasonably well understood and dates back to studies conducted as early as 1968. These early studies, and subsequent studies, demonstrated that compounds such as silane could apparently be generated in situ from solid silicon and a microwave plasma containing hydrogen free radicals. Moreover, the reaction of the hydrogen free radicals on the solid silicon could be combined with redeposition of the product silane on a substrate. However, special measures were required to adapt this theoretically interesting technology to the specific problems normally dealt with by those skilled in the art of thin film deposition. For example, it has now been discovered that the utilization of a microwave plasma for efficient and controllable thin film deposition requires that the process for utilizing the plasma be divided into distinct stages, and the apparatus for carrying out the process must therefore be divided into distinct zones.

According to this invention, the process for utilizing the microwave plasma involves the following key steps:

(a) Forming a microwave plasma in an irradiated zone which is irradiated with microwave energy of a certain wavelength, the microwave plasma being formed from a volatile or volatazable species which is heterolytically or, more preferably, homolytically fissionable in the irradiated zone by subjecting the volatile or volatilizable species to the microwave energy, thereby providing a reactive gas or gases containing free radicals (and perhaps some ions), (b) conveying, downstream from the irradiated zone, the reactive gas or gases containing the free radicals (and perhaps some ions) to a downstream reaction zone containing a target comprising the metal or metalloid; a reaction ensues as a reactive gas comes into contact with the metal or metalloid, and a gaseous product containing a hydride or organometallic compound (or a mixture thereof) is formed, (c) conveying the gaseous product further downstream to a downstream treatment or collection zone. If this third zone is a treatment zone it contains a substrate which is contacted with the gaseous product or a decomposition product of it. If the third zone is a collection zone, a pump or other conveying means draws the hydrides or organometallic compounds into a storage zone.

Thus, an apparatus of this invention includes a plasma-forming zone (and preferably also a feed material storage zone upstream of the plasma-forming zone), a microwave energy generation means (such as a magnetron), a reaction zone, and a treatment or collection zone. It is particularly important that the microwave energy is substantially confined to the plasma-forming zone and is generally absent from the reaction zone. Although this invention is not bound by any theory, it is believed that the reaction taking place in the reaction zone is essentially chemical in nature, hence this reaction zone is located in a region substantially free of microwave energy or containing minimal microwave energy, so that microwave energy from the plasma-forming zone will have little or no influence on the chemical reaction or reactions taking place in the reaction zone. In other words, the reaction zone of the apparatus is located downstream from the plasma-forming zone. The flow through the apparatus starts with feed material fed to the plasma-forming zone, a flow of ions and/or radicals passes from the plasma-forming zone to a separate chemical reaction zone, and a flow of gaseous product passes from the reaction zone to a treatment or collection zone.

Advanced electronic (e.g. solar cells, photovoltaic cells, etc.) or catalytic materials (e.g. thin-layer heterogenous catalysts) can be made by the process of this invention. Moreover, this process does not require an ultrahigh vacuum; indeed, a very high vacuum interferes with the process. On the other hand, the pressure inside the apparatus cannot be so high that free radicals will tend to re-combine before reaching the chemical reaction zone.

Although the effect of electromagnetic energy of various wavelengths on molecules and atoms is not fully understood, available knowledge has enabled researchers to propose guidelines for these effects. See, for example, D. A. Skoog et al, *Principles of Instrumental Analysis,* Holt, Reinhart, Winston (1971), page 13. For example, it is believed that the principal effect of the absorption of infrared energy upon molecules is to increase molecular vibration. Infrared energy is generally considered to be in the portion of the electromagnetic spectrum wherein wavelengths are longer than 0.7 micrometer (700 nm) but not longer than about 100 micrometers, i.e. frequencies less than about 400,000 GHz but generally more than about 3000 GHz. Far infrared (e.g. wavelengths longer than 30 micrometers) can have an effect upon molecular rotation as well as molecular vibration. Microwave energy (less than 3000 GHz but more than 100 MHz; wavelengths greater than 0.1 mm but less than 3 m) on the other hand, tends to stimulate molecular rotation almost exclusively, particularly at frequencies from about 1000 MHz (about 1 GHz) to 600,000 MHz (600 GHz), corresponding to wavelengths from 0.3 m to 0.5 mm (500 micrometers). Since, in this invention, it is desirable to maximize molecular rotation in the plasma-forming zone, thereby maximizing free radical formation, the preferred microwave frequencies are about 1–600 GHz, more preferably about 1–100 GHz (corresponding to wavelengths of about 3 mm to 0.3 m). Magnetrons which generate frequencies of 300 to 30,000 MHz, i.e. microwaves from a centimeter to about a meter in length are readily available, hence the 1 to 10 GHz (1000 to 10,000 MHz) range of frequencies is especially practical.

BRIEF DESCRIPTION OF THE DRAWING

FIG. 3 is a schematic representation of a portion of another modified version of the apparatus of FIG. 1, this further modification being designed to provide parallel reaction zones for product gases which may interact with each other.

DETAILED DESCRIPTION

Figure 1:
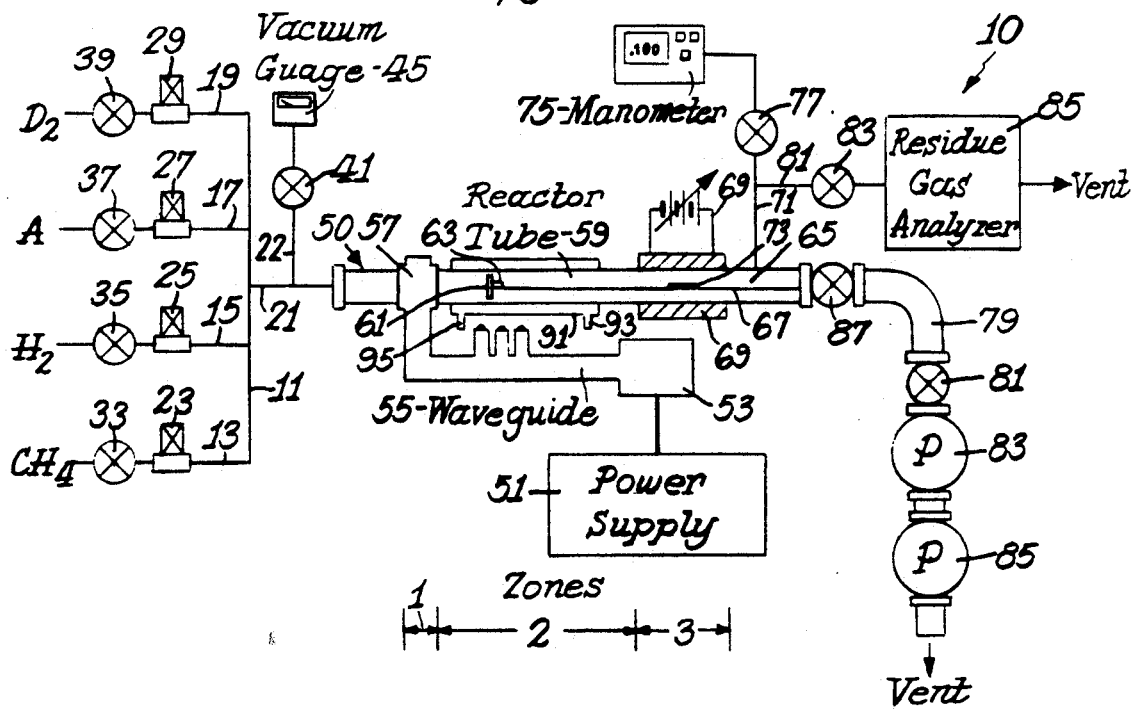
FIG. 1 is a schematic representation of an apparatus of this invention specifically designed to treat substrates.

As will be apparent from the foregoing summary of the invention, this invention has several aspects, including a process for treating substrates with a hydride and/or organometallic species, a process for forming and collecting precursors for treating or forming advanced materials, substrates (such as electronic materials) treated in accordance with one or more processes of this invention, and apparatus specifically designed to carry out these processes.

Fundamental Aspects of the Process of this Invention

The process of this invention relies upon the basic scientific principles of microwave plasma generation, the interaction of radicals produced in the microwave plasma with a target material such as a metal or metalloid, thereby forming a product such as a hydride or organometallic compound, and the storage or in-situ use of the product. An important aspect of this process is that the microwave plasma generation takes place in one distinct zone, the interaction between free radicals and the target material takes place in a second distinct zone, and the product produced in the second zone is collected or utilized in a third zone. The target material becomes the source for a product such as a hydride or organometallic compound when impinged upon by free radicals.

Process conditions, rates of flow, and linear velocities through the various zones are also important. The plasma-forming zone (e.g. a cavity resonator attached to a waveguide) is irradiated with microwave energy, and the microwave energy wavelength is selected to maximize molecular rotation effects while keeping the cavity large enough to be practical. (The size of a typical cavity bears some relationship to the wavelength.) "Microwave" energy is normally thought of as having a wavelength greater than far infrared waves (e.g. >100 or 200 micrometers) but less than radio-frequency waves (e.g. less than about a meter). Although most of the microwave spectrum is theoretically useful in this invention, wavelengths longer than about 0.5 meter have a much weaker effect upon molecular rotation as compared to wavelengths of about 0.3 meter or less (frequencies >1000 MHz). At the other end of the spectrum, wavelengths shorter than about 3 mm (frequencies >100 GHz) have a greater tendency to produce molecular vibration effects as compared to wavelengths longer than 3 mm. Notwithstanding the weaker effect of radio-frequency (r-f) waves upon molecular rotation, however, Veprek et al, *Solid State Electron.*, 11, 686 (1968) observed silane formation from hydrogen and silicon in an r-f plasma (28 MHz, 10 watts). The use of r-f plasmas is avoided in this invention, not because r-f plasmas are inoperative, but because free radical concentrations are lower than in microwave plasmas.

A microwave plasma is capable of generating free radicals, e.g. $H\cdot$ from $H_2$, $F\cdot$ from $F_2$, $CH_3\cdot$ from $CH_4$, $CH_3O\cdot$ from $CH_3OCH_3$, etc. These radicals are normally short-lived, because of their tendency to interact with each other to form $H_2$, $C_2H_6$, $CH_4$, etc. In order to preserve the free radicals for use in this invention, they are conveyed quickly from the microwave cavity (plasma-forming zone), where the temperature may inherently rise to, say 300°-1000° C., into a reaction zone which is relatively cooler, is under subatmospheric pressure, and is free or substantially free of microwave energy. This flow of free radicals is directed through the reaction zone to a target material at a high linear velocity. The target material can be temperature-controlled to facilitate reactions with the stream of free radicals and also to promote volatilization of the resulting product or products, so long as the temperatures are near ambient or only moderately elevated, e.g. 25°-150° C., more preferably 25°-75° C. Even at temperatures as low as 70° C., some decomposition of the desired product gas can be observed. The subatmospheric pressure in the reaction zone also facilitates volatilization of the product obtained from the interaction of the target material and the free radical stream; moreover, excessive density of the free radical stream would tend to extinguish too many free radicals through recombination or coupling reactions (e.g. $H\cdot + H\cdot \rightarrow H_2$). The target material, when in the form of a thin wafer, is not necessarily at a uniform temperature. The upstream or leading edge (closest to the plasma-formation zone) may be hotter (e.g. 50°-200° C.), while the trailing edge may be cooler (e.g. 25°-75° C.).

The temperature in the receiving zone (downstream from the target) is independent of the temperature in the reaction zone and may vary significantly, depending upon whether the receiving zone is a collection trap (in which case temperatures below 0° C., e.g. 50° to 200° K., are desired) or a treatment zone, wherein a substrate is coated, doped, or otherwise modified chemically and/or physically by the volatilized product obtained in the reaction zone. For treatment of a substrate, the temperature in the receiving zone should be high enough to facilitate decomposition of the volatilized product, e.g. decomposition of silane ($SiH_4$) into silicon and hydrogen. If desired two volatilized products may converge in the receiving zone to treat a substrate or form a product such as gallium arsenide; for example, a stream of $Ga(CH_3)_3$ can converge with a stream of $AsH_3$ to provide GaAs. As noted previously, some product decomposition can be observed at temperatures as low as 70° C.; accordingly, it is not necessary to heat the substrate to temperatures significantly higher than about 500° C., and temperatures of 30° to 300° C. are normally preferred.

As noted above, the subatmospheric pressure in the reaction zone should not be so high as to favor recombination of free radicals, hence pressures above about 10 or 20 torr normally result in less efficiency in the reaction zone. At the other extreme, pressures significantly below 0.01 torr interfere with microwave plasma formation and also make pumping of the free radical stream difficult. The optimum subatmospheric pressure is about 0.05 to 10 torr, e.g. $10^{-1}$ torr.

The target (source material) in the reaction zone should be spaced apart from the microwave cavity (plasma-forming zone) so that the free radical stream can cool down below 500° C. and can escape residual microwave energy leaking out of the cavity. A distance of 2 to 10 cm is typical, the optimum distance being 3 to 5 cm. To maintain a significant amount of free radical character the free radical stream should preferably traverse this distance in a small fraction of a second, e.g. in 0.05 seconds or less, more preferably <5000 microseconds. Accordingly, linear velocities of about 50 to 20,000 cm/sec are used, e.g. 1000 to 10,000 cm/sec. Once the volatilized product (e.g. $SiH_4$, $AsH_3$, etc.) has been formed, flow rates are less critical, but the product may be highly reactive, and continued high flow rates are desirable to avoid side reactions. When the product is to be stored in a cold trap it is desirable to convey the product to the trap in a small fraction of a second, e.g. in 10 to 1000 microseconds.

The interior of the plasma-forming, reaction, and receiving zones is normally kept as dry and free of air as possible, since air and moisture can readily react with free radicals and the like.

High flow rates are obtainable when molecular fluxes exceed $10^{15}$ to $10^{20}$ molecules/$cm^2$-sec, and when the pressure inside the zones of major importance (e.g. in the reaction zone) exceeds $10^{-3}$ torr (e.g. 0.05-10 torr). When pressures and fluxes are too low, conventional pumping systems will not be very effective, and complex, expensive focussed magnetic field arrangements may be needed to convey the free radicals quickly. Under the conditions contemplated for this invention, however, a combination of a roots pump with a rotary vane pump will provide very high linear velocities. The roots pump enables the rotary vane pump to propel the off-gases ($H_2$, $CH_4$, $C_2H_6$, etc.) out of the system with great speed, while also conveying the free radicals quickly to the target and pulling the volatilizable product along rapidly, e.g. at linear velocities of at least about 50-1500 cm/sec. If desired, an electromagnetic field can assist in directing free radicals or confining free radicals to the region near the target.

Gases which form free radicals in a microwave plasma and hence can serve as feed gases for use in this invention are legion. Molecular hydrogen (and its isotopes $D_2$ and $T_2$) is one of the preferred feed gases. Gases which form aliphatic, cycloaliphatic or aromatic free radicals (e.g. methane, benzene, etc.) constitute a class of preferred feed gases. Halogens can also be decomposed into free radicals, and a variety of organic compounds (ethers, aldehydes, ketones, etc.) can be useful.

The preferred target material is a metal or metalloid, e.g. an element of Groups Ib to VIII of the Periodic Table, a metal of Group IIIa, silicon or a metal of Group IVa, arsenic or a higher atomic weight element of Group Va, or an element of Group VIa, e.g. an element above oxygen in the Periodic Table. Some of the transition metals form transportable hydrides or halides or organo-metallic compounds only with great difficulty, however; for example, high temperatures may be needed to volatize some of these transition metal compounds, even under a pressure of $10^{-1}$ torr or less.

The choice of substrates is not greatly limited by the inherent characteristics of this invention. Almost any metal or metalloid or crystalline substance which can be doped or coated or otherwise modified by a second metal or metalloid can be used in this invention. Advanced materials such as photovoltaic cells, doped semiconductors, etc. can be made using the principles of this invention.

Alternatively, this invention can be used to synthesize unusual or highly specialized products such as organometallic compounds. Unlike conventional chemical synthesis of organometallic compounds such as Grignard agents, the formation of the organometallic moiety in this invention occurs outside of any solvent system and involves a free radical attack upon a metal. Organometallic compounds are of course highly reactive with air or moisture, hence the freshly synthesized organometallic species are immediately conveyed from the site of their formation in the reaction zone (wherein a stream of free radicals impinges upon a metallic wafer) into a receiving zone comprising a cold trap. The cold trap is preferably kept at a very low temperature, e.g. a temperature in the range of 50° K. to 200° K. Liquid nitrogen is readily available and provides a temperature below 80° K. A dry ice trap can provide temperatures below 200° K. If desired, the thus-trapped organometallic compounds can be carefully transferred to a dry organic liquid medium containing an aliphatic ether, so that a more conventional, ether-complexed species can be obtained.

In an important embodiment of this invention, the hydride or organometallic product formed in the reaction zone can be utilized in situ. In this embodiment of the invention, the receiving zone contains a substrate of the type described above, e.g. a metal or metalloid or crystalline substance which can be doped or coated or otherwise modified to provide an advanced material suitable for use in electronic devices, photovoltaic cells, etc. Accordingly, the feed gas does not have to be a highly toxic or hazardous substance such as silane or arsine and can be hydrogen or a stable organic compound such as methane. Hydrogen, while highly combustible and even explosive under certain conditions is considerably safer than either arsine or silane or other volatile hydrides of this type. In the process of this invention, the hydrogen is converted to hydrogen free radicals which exist for only a fraction of a second; the free radicals are in turn reacted with a metal or metalloid to form a hazardous hydride or similar precursor which also exists for only a fraction of a second, because it is promptly decomposed into its elements (e.g. silicon and hydrogen) which are easily dealt with. The hydrogen is simply pumped away, and the silicon (or other metalloid or metal) is generally integrated into and/or deposited on the substrate in the receiving zone. In short, this invention contemplates the formation of highly unstable free radicals from a relatively stable feed gas, conversion of these free radicals into a somewhat more stable product (precursor) gas, and decomposition of the product gas to obtain a desired decomposition product in exactly the location where it is needed, i.e. on or in the substrate. To achieve treatment of the substrate, storage of a hazardous compound such as silane is completely avoided.

Preferred pressures used in this invention are in the range of 0.1 to 10 torr total. Flow rates are preferably in the range from 1 sccm to 100 sccm. Free radical concentrations tend to be in the range of from $10^{-8}$ to $10^{-6}$ gmoles/cm$^3$. Diffusivities of the gases will be on the order of $10^4$ to 10 cm$^2$/sec. Linear velocities through the reaction zone are preferably in the range from 100 to 1500 cm/sec. The Reynolds number is preferably about 10 at 1 torr and the Peclet number will also be approximately 10 at 1 torr. Gas flows are preferably kept generally in the viscous regime, bordering on the transition regime at the lowest pressures. Flows can be laminar throughout the process pressure regime. The power used to generate microwave radiation (e.g. microwave radiation of 2 to 30 cm in wavelength) is typically on the order of 10 to 10,000 watts more typically 500-5000 watts.

DESCRIPTION OF THE PREFERRED EMBODIMENTS OF THE APPARATUS

Figure 2:
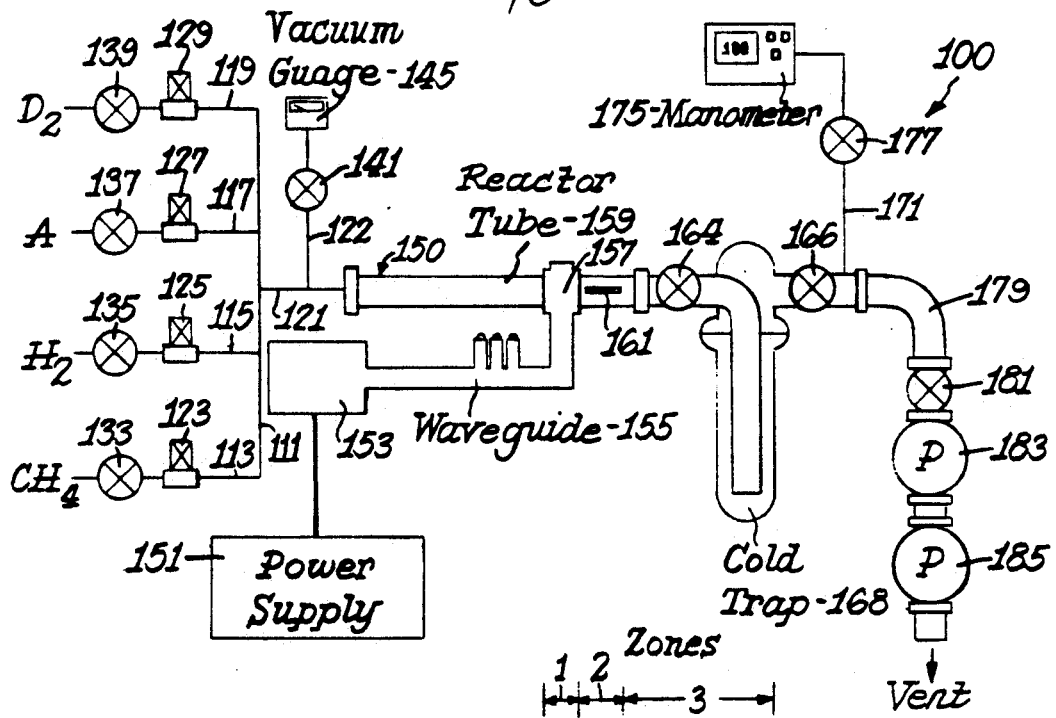
FIG. 2 is a modified version of the apparatus of FIG. 1 which is designed to collect precursors for treating advanced materials.

Turning now to the Drawing, it will be apparent that apparatus 10 of FIG. 1 is constructed and arranged to provide, inter alia, zone 1, which is the plasma-forming zone (plasma formation taking place inside of cavity 57), zone 2, which is the reaction zone containing the target 61 (the target becomes the source of the product or precursor to be conveyed downstream), and zone 3, the receiving zone 65, which contains the substrate 73 which is to be coated or doped or otherwise modified. FIG. 2 illustrates an analogous apparatus 100 having a similar arrangement of three zones and therefore includes a microwave cavity 157 and a target or source material 161, but the product obtained in the reaction zone containing target 161 is conveyed to a cold trap 168, where it can be stored.

The two embodiments illustrated in FIG. 1 and FIG. 2 share similar feed manifold arrangements: the feed manifold 11 (FIG. 1) or 111 (FIG. 2) being made up of lines 13, 15, 17, and 19 in FIG. 1 and 113, 115, 117, and 119 in FIG. 2.

Valves 33, 35, 37, and 39 (FIG. 1) or 133, 135, 137, and 139 (FIG. 2) permit the operator of the apparatus to select the feed gas (or purge gas) and blend feed gases, if desired. Thus, valve 39 (FIG. 1) or 139 (FIG. 2) controls deuterium feed line 19 or 119, respectively; valve 37 (FIG. 1) or 137 (FIG. 2) controls argon feed lines 17 or 117, respectively; valve 35 (FIG. 1) or 135 (FIG. 2) controls hydrogen feed line 15 or 115, respectively; and valve 33 or 133 controls methane feed line 13 or 113, respectively. Other organic compounds could be fed through lines 13 or 113 in lieu of methane, e.g. higher hydrocarbons, ethers, ketones, etc. The argon feed lines 17 and 117 provide an inert purge gas used to purge the system of residual traces of air and moisture prior to operation with one or more of the other three feed gases.

The selected feed gas or gases pass into line 21 (FIG. 1) or 121 (FIG. 2) into a long tube 50 (FIG. 1) or 150 (FIG. 2) which is protected from the ambient environment (particularly from air and moisture) and which is at least partially evacuated. Tube 50 or 150 communicates with a cavity 57 (FIG. 1) or 157 (FIG. 2) which is irradiated with microwave energy and provides the plasma-forming zone, previously described as zone 1. The subatmospheric pressure in the system (particularly in tube 50 or 150) can be continuously monitored by observing the vacuum gauge 45 (FIG. 1) or 145 (FIG. 2) which is connected to a sampling line 22 or 122, respectively. Sampling lines 22 or 122 can be isolated from the system, if desired, by closing valve 41 or 141, respectively.

The microwave energy used to irradiate cavity 57 or 157 is generated by magnetron 53 (FIG. 1) or 153 (FIG. 2). In a preferred embodiment of this invention, magnetron 53 or 153 generates continuous microwaves and operates at 2.45 GHz and one kilowatt of power. Magnetrons 53 and 153 are powered by power supplies 51 and 151, respectively. An example of a suitable microwave generating system is an ASTEX S-1000 with a tunable head dummy load, dual 50 db directional coupler and precision three stub tuner. The power supply 51 or 151 regulates to 0.1% with less than 1% ripple. The 2.45 GHz (2450 MHz) microwave energy passes along waveguide 55 (FIG. 1) or 155 (FIG. 2) to cavity 57 or 157, respectively. Leakage of microwave energy from waveguides 55 or 155 is minimal and has no disruptive effect upon the system. Even the most carefully engineered cavity 57 or 157 cannot contain the microwave energy perfectly, however. Typically, a "glow" of microwave energy results from the inductive coupling of microwave energy into cavity 57 (FIG. 1) or 157 (FIG. 2). This "glow" extends outward from cavity 57 or 157 in all directions and hence extends into the reactor tube segment 59 (FIG. 1) or 159 of tube 50 or 150. The extent of downstream "glow" in reactor tube 59 or 159 depends upon a variety of factors, including the wavelength of the microwave energy in cavity 57 or 157. The target 61 (FIG. 1) or 161 (FIG. 2) is preferably placed beyond the "glow" but not so far away from the cavity 57 or 157 that free radical impingement upon target 61 or 161 is significantly decreased due to free radical recombination. Moreover, target 61 or 161 should be spaced far enough apart from cavity 57 or 157 to facilitate some cooling of the stream of free radicals flowing out of cavity 57 or 157. In a typical embodiment of this invention, the "glow" extends about one or two centimeters downstream from the exit port of cavity 57 or 157, hence the target 61 or 161 is typically spaced more than one centimeter from the exit port of cavity 57 or 157. On the other hand, the spacing of the target 61 or 161 is typically less than about five centimeters, so that a major amount of the free radicals in the free radical stream passing into reactor tube 59 or 159 is preserved in the free radical state. When the free radicals contact target 61 or 161 it can be assumed that substantially 100% of them will react with the target.

In the apparatus 10 of FIG. 1, good temperature control in the reactor tube 59 is particularly desirable. Accordingly, a cooling jacket 91 surrounds a substantial portion of reactor tube 59, particularly the portion in which target 61 is situated. Cooling jacket 91 is provided with a water inlet 93 and outlet 95 in the conventional manner. The water circulating through cooling jacket 91 is of course confined strictly to the area enclosed by the jacket and cannot permeate or diffuse into the interior of reactor tube 59. For monitoring of the temperature of target 61, a thermocouple 63 is attached to its downstream side, and the circuit for the electrical signal from thermocouple 63 passes through the elongated positioning device 67 holding target 61 in place. To maximize the etching rate of target 61, target 61 is positioned perpendicularly to the flow of free radicals emerging from cavity 57. However, other orientations of target 61 can be useful, including the horizontal or longitudinal orientation of target 61 shown in FIG. 2 or an inclined orientation (not shown) which, if introduced into FIG. 1, would involve a clockwise rotation of target 61, so that the leading edge of target 61 would be lower than the trailing edge. Although target 61 of FIG. 2 is shown in a horizontal orientation, a vertical or perpendicular orientation would be useful here also, since it would tend to maximize the etching rate, thereby maximizing the production of hydride and/or organometallic product or products, so that the space-time yield of this product or these products would also be maximized.

As noted previously, the temperature in the third zone (the receiving, i.e. treatment or collection, zone) is independent of the temperature in the second zone (the reaction zone). In apparatus 10 of FIG. 1, the temperature in the treatment zone, which contains substrate 73 is controlled by resistance heater 69. The temperature of resistance heater 69 can be varied over a wide range. This temperature is selected to maximize decomposition of the gaseous product produced by interaction of target 61 with the free radical stream, but this decomposition temperature is selected so as to be consistent with other objectives of this invention. For example, the structure of substrate 73 which is to result after treatment with the gas flowing downstream from the reactor tube 59 may be rather delicate and should not be damaged by excess heat.

Further monitoring of the behavior and performance of apparatus 10 (of FIG. 1) or 100 (of FIG. 2) is provided by sampling lines 71 and 171, respectively. These sampling lines communicate with a manometer 75 or 175, respectively, and a valve 77 or 177 is provided in line 71 or 171, so that this line can be isolated from the system, whenever such isolation is desirable. Apparatus 10 of FIG. 1 is also provided with a residue gas analyzer 85, connected to sampling line 71 via line 81, which is provided with valve 83, so that occasional or periodic or continuous analysis can be provided for the gaseous decomposition product resulting when the precursor decomposes on or near substrate 73.

Apparatus 100 of FIG. 2 does not contain a substrate to be treated; accordingly, zone 3 of FIG. 2 is not a treatment zone but rather a storage zone. The volatilizable product produced when the free radicals impinge upon target 161 is conveyed very quickly to the bottom of cold trap 168. Typically, less than a thousandth of a second (e.g. about 100 microseconds) is needed to convey the volatilizable product from target 161 to the bottom of cold trap 168. Cold trap 168 is typically provided with a jacket (not shown) containing liquid nitrogen or the like. Cold trap 168 can be isolated partially or completely from the system by closing one or both of valves 164 and 166.

In apparatus 10 and 100, conveyance of free radicals, product or precursor gases, residue gases, etc. is provided by a pumping system comprising Roots Pump 83 (FIG. 1) or 183 (FIG. 2), which enables a second pump, rotary vane pump 85 (FIG. 1) or 185 (FIG. 2) to operate with high effectiveness providing high linear velocities from the exit port of cavity 57 or 157 all the way to (and beyond) the pumping system. The pumping system can also be isolated from the rest of apparatus 10 or 100 by closing valve 81 (FIG. 1) or 181 (FIG. 2). In addition, FIG. 1 includes a valve 87 for isolating zones 1, 2, and 3 from the line 79 which leads to the downstream end of the system. In apparatus 200, valve 166 serves the analogous function of permitting isolation of zones 1, 2, and 3 from the line 179 which leads to the downstream end. These valves (indeed, all the valves with the exception of some of the valves in the feed lines and, on occasion, valves in the sampling lines) are normally open during operation of the system.

Because purity of feed gases is of great importance in this invention, apparatus 10 and apparatus 100 are provided with filters 23, 25, 27, and 29 (FIG. 1) or 123, 125, 127, and 129 (FIG. 2) in the feed lines of manifold 11 or 111, respectively.

The preferred embodiments of this invention are especially ideal for doping semiconductor materials. As is known in the art, a handful of atoms of a metal or metalloid, when introduced into certain crystal structures, will create P-character or N-character or the like, and P/N junctions can be created, triodes can be manufactured, and so forth. When the precursor for the dopant is a hazardous material such as gallium arsenide, an apparatus of this invention provides a safe and effective way of generating the dopant precursor from relatively safe materials and then using this precursor promptly and efficiently, so that many of the complicated safeguards required in industry will no longer be needed.

FIG. 3 illustrates an embodiment of the invention based upon the embodiment of FIG. 1 but permitting the parallel use of two different feed gases, parallel reactions between the different feed gases and different targets, formation of parallel streams of product gases which would react with each other if commingled, and a confluence zone in which the two product gases can combine and form a third product. In the embodiment of FIG. 3, the third product is immediately used in situ to treat a substrate; however, in a further embodiment of this invention (not shown), the third product can be stored rather than used. Thus this further embodiment is based upon FIG. 2 rather than FIG. 1 and provides a cold trap (similar to cold trap 168 of FIG. 2) communicating with the aforementioned confluence zone, rather then a treatment zone.

Turning now to FIG. 3, which is a partial schematic of an apparatus 200 in which the microwave generating system, the manifold, the pumping system, the sampling lines and the monitoring devices are not shown (since they are the same as in FIG. 1), a first feed gas such as methane is fed to tube 250, and a second feed gas such as hydrogen is fed to tube 350. Microwave plasmas are formed in parallel cavities 257 and 357 with the assistance of microwave energy supplied by waveguides 255 and 355. Parallel streams of free radicals (e.g. methyl free radicals in reactor tube 259 and hydrogen free radicals in reactor tube 359) impinge on parallel targets 261 (e.g. gallium metal) and 361 (e.g. elemental arsenic), both targets being positioned within reactor tubes 259 and 359, respectively. Thus, zone 1 of apparatus 200 comprises the parallel plasma-forming zones in cavities 257 and 357. Zone 2 of apparatus 200 comprises parallel reactor tubes 259 and 359, where different reactive gases are produced from targets 261 and 361. Zone 3 of apparatus 200 has two sub-zones, a confluence or convergence region 274, where a chemical reaction takes place between the parallel product streams, and a substrate 273, heated, if necessary, by a resistance heater 269, so that the third product formed from the parallel product streams from tubes 259 and 359 can be used immediately in situ. A valve 287 analogous to valve 87 of FIG. 1 can be used to isolate the reactor tubes and zone 3 from the pumping system (not shown).

Thus, for example, methyl free radicals in reactor tube 259 can react with a gallium target 261 to form $Ga(CH_3)_3$, and hydrogen free radicals in reactor tube 359 can react with arsenic target 361 to form arsine ($AsH_3$). In the confluence region 274 of zone 3, $Ga(CH_3)_3$ can react with $AsH_3$ to form gallium arsenide, which can be used to treat substrate 273. Substrate 273 can be, for example, an electronic device or material.

Apparatus 100 of FIG. 2 is practical for use in the synthesis of modest amounts of highly specialized, highly reactive or metastable chemicals such as hydrides and organometallic compounds. Even on a laboratory scale, fluxes adequate to produce nanomolar or even millimolar amounts of hydrides or organometallic compounds can be provided. When scaled up, an apparatus 100 of FIG. 2 can provide amounts approaching the molar level. If desired, the organometallic or hydride product can be converted to a more stable material, which is in an extremely high state of purity and can simply be stored for future use. For example silane can be converted to pure silicon and pure hydrogen, and the silicon can be containerized and sold as pure silicon.

What is claimed is:

1. A process for treating a substrate with a hydride or organometallic species, comprising the steps of:
   a. forming a microwave plasma in an irradiated zone which is irradiated with microwave energy, and utilizing said irradiated zone to form, from a volatile or volatizable species which is heterolytically or homolytically fissionable in said irradiated zone, a reactive gas or gases containing free radicals, ions, or mixtures of free radicals and ions,
   b. conveying and directing, downstream from the irradiated zone, a said reactive gas containing free radicals, ions, or mixtures of free radicals and ions of said volatile or volatizable species to a reaction zone located downstream from and distinct from said irradiated zone and containing a target comprising a liquid or solid metal or metalloid of the transition series of elements or of Groups Ia to VIa of the Periodic Table, thereby forming a gaseous product containing a hydride or organometallic compound or a mixture thereof, a flow of said reactive gas being thereby directed from the irradiated zone to said target, c. conveying the said gaseous hydride or organometallic product further downstream to a treatment zone containing a substrate, and causing the gaseous product or a decomposition product thereof to contact said substrate.

2. A process according to claim 1, wherein the microwave energy has a wavelength of about 0.003 to 0.3 meter, and wherein, in said step b., a said reactive gas is plasma continuously contacted with the metal or metalloid by causing a continuous flow of the gas to pass over a liquid or solid surface of the liquid or solid metal or metalloid, said reactive gas containing a major amount of free radicals and a minor or negligible amount of ions.

3. A process according to claim 2, wherein the volatile or volatilizable species is molecular hydrogen or an organic molecular species capable of forming aliphatic free radicals.

4. A process according to claim 3, wherein the volatile or volatilizable species is molecular hydrogen, and the microwave plasma contains at least nanomolar quantities of hydrogen free radicals, and wherein said gaseous product contains at least nanomolar quantities of a hydride.

5. A process according to claim 3, wherein the volatile or volatilizable species is a hydrocarbon molecule, and the gaseous product of said step b contains an organometallic compound.

6. A process according to claim 5, wherein the subatmospheric pressure is greater than 0.001 torr but less than about 10 torr.

7. A process according to claim 2, wherein the gaseous product of said step b is caused to deposit on said substrate, and said gaseous product liberates free metal or metalloid as it deposits on said substrate.

8. A process according to claim 2, wherein free radicals in a said reactive gas are conveyed or directed by means of a moving or changing or focused electromagnetic field.

9. A process according to claim 2, wherein the pressure inside the irradiated zone and the reaction zone is subatmospheric.

10. A process according to claim 2, wherein the metal or metalloid is a transition element of Groups Ib to VIII of the Periodic Table, a metal of Group IIIa, silicon or a metal of Group IVa, arsenic or a higher atomic weight element of Group Va, or an element of Group VIa having an atomic weight of at least 32.

11. A process according to claim 2, wherein the gaseous product of said step b is decomposed to liberate the metal or metalloid in elemental form, and the thus-liberated metal or metalloid is brought into contact with the substrate.

12. A process according to claim 2, wherein the gaseous product of said step b is caused to react with the substrate.

13. The process according to claim 1, wherein a different microwave plasma is formed in each of a plurality of irradiated zones, thereby obtaining a different reactive gas from each irradiated zone; each reactive gas is conveyed downstream from each irradiated zone to a reaction zone located downstream from and distinct from each irradiated zone and containing a said target, each reaction zone thereby forming a different gaseous product containing a hydride or organometallic compound or mixture thereof; the plurality of different gaseous products are then reacted with each other, and the resulting reaction product is then conveyed to a said treatment zone.

14. A process for preparing and recovering a hydride or organometallic species or a mixture thereof, comprising the steps of:

a. forming a microwave plasma in an irradiated zone which is irradiated with radio-frequency energy having a wavelength ranging from about 0.01 to about 1 meter, and utilizing said irradiated zone to form, from a volatile or volatilizable species which is homolytically fissionable in said irradiated zone, a reactive gas or gases containing at least nanomolar quantities of free radicals of said volatile or volatilizable species, b. continuously coveying downstream a said reactive gas containing at least nanomolar quantities of free radicals of said volatile or volatilizable species to a reaction zone located downstream from the irradiated zone, said reaction zone containing a liquid or solid metal or metalloid of the transition series of elements or of Groups Ia to VIa of the Periodic Table, and chemically reacting a said reactive gas with said metal or metalloid, thereby forming a gaseous product containing a hydride or organometallic compound or a mixture thereof, c. conveying said gaseous product further downstream to a collection zone and collecting said hydride or organometallic compound or mixture thereof or a reaction or decomposition product thereof.

* * * * *